(12) United States Patent
Numata

(10) Patent No.: US 8,699,539 B2
(45) Date of Patent: Apr. 15, 2014

(54) PHOTONIC CRYSTAL SURFACE EMITTING LASER AND METHOD OF MANUFACTURING THE SAME

(75) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/482,025

(22) Filed: May 29, 2012

(65) Prior Publication Data

US 2012/0327966 A1 Dec. 27, 2012

(30) Foreign Application Priority Data

Jun. 21, 2011 (JP) ................. 2011-137481

(51) Int. Cl.
*H01S 5/183* (2006.01)

(52) U.S. Cl.
USPC ................ 372/50.124; 372/45.01

(58) Field of Classification Search
USPC .................................. 372/50.124
See application file for complete search history.

(56) References Cited

U.S. PATENT DOCUMENTS

| | | | |
|---|---|---|---|
| 4,677,634 A * | 6/1987 | Meuleman et al. | 372/46.01 |
| 7,796,660 B2 | 9/2010 | Numata | 372/39 |
| 2007/0201526 A1 * | 8/2007 | Hori | 372/50.124 |
| 2010/0002738 A1 * | 1/2010 | Takakura et al. | 372/44.011 |
| 2011/0134941 A1 * | 6/2011 | Hoshino et al. | 372/7 |

FOREIGN PATENT DOCUMENTS

| | | |
|---|---|---|
| JP | 2000-091705 | 3/2000 |
| JP | 2006-165255 | 6/2006 |
| JP | 2008-098379 | 4/2008 |
| JP | 2008-227095 | 9/2008 |

* cited by examiner

*Primary Examiner* — Xinning Niu
(74) *Attorney, Agent, or Firm* — Fitzpatrick, Cella, Harper & Scinto

(57) ABSTRACT

A photonic crystal surface emitting laser, having an n-type cladding layer formed on a substrate; an active layer formed on the n-type cladding layer; an electron blocking layer formed on the active layer and made of a second p-type semiconductor; and a two-dimensional photonic crystal layer that is formed on the electron blocking layer, includes a plurality of layers that are made of a first p-type semiconductor and have different band gaps, and has a high and a low refractive index portion in an in-plane direction. The band gaps of the plurality of layers are smaller than a band gap of the second p-type semiconductor and decrease stepwise or continuously in a lamination direction of the plurality of layers. A third p-type semiconductor having an acceptor doping concentration smaller than that of the second p-type semiconductor is disposed so as to cover a surface of the electron blocking layer.

18 Claims, 18 Drawing Sheets

FIG. 3

LAYER STRUCTURE OF PHOTONIC CRYSTAL LASER 100

| NAME | COMPOSITION | DOPANT, DOPING CONCENTRATION (cm⁻³) | THICKNESS (nm) |
|---|---|---|---|
| p-TYPE ELECTRODE 108 | Au, Ni |  | 15, 5 |
| p-TYPE CONTACT LAYER 107 | GaN | Mg, $1 \times 10^{20}$ | 160 |
| PHOTONIC CRYSTAL LAYER 111* | GaN/Air | Mg, $2 \times 10^{19}$, 0 | 110 |
| PHOTONIC CRYSTAL LAYER 110* | $Al_{0.08}Ga_{0.92}N$/Air | Mg, $2 \times 10^{19}$, 0 | 55 |
| PHOTONIC CRYSTAL LAYER 110* (INCLUDING COVERING LAYER 112) | $Al_{0.08}Ga_{0.92}N$/GaN | Mg, $2 \times 10^{19}$, $2 \times 10^{18}$ | 55 |
| ELECTRON BLOCKING LAYER 105 | $Al_{0.15}Ga_{0.85}N$ | Mg, $2 \times 10^{19}$ | 20 |
| OPTICAL GUIDE LAYER | GaN | 0 | 80 |
| ACTIVE LAYER 103 | $In_{0.09}Ga_{0.91}N$/GaN 3QW | 0 | 2.5, 7.5 × 3 |
| OPTICAL GUIDE LAYER | GaN | Si, $2 \times 10^{19}$ | 20 |
| n-TYPE CLADDING LAYER | $Al_{0.08}Ga_{0.92}N$ | Si, $2 \times 10^{19}$ | 600 |
| SUBSTRATE | GaN |  |  |
| n-TYPE ELECTRODE | Ti, Al |  | 20, 100 |

*PHOTONIC CRYSTAL HAS 160 nm PERIOD AND 64 nm VACANCY DIAMETER

FIG. 5

|  | LIGHT CONFINEMENT COEFFICIENT |
|---|---|
| PHOTONIC CRYSTAL LASER 100 | 4.9 |
| COMPARATIVE EXAMPLE A ($Al_{0.08}Ga_{0.92}N$/Air PHOTONIC CRYSTAL) | 2.7 |
| COMPARATIVE EXAMPLE B (GaN/Air PHOTONIC CRYSTAL) | 4.7 |

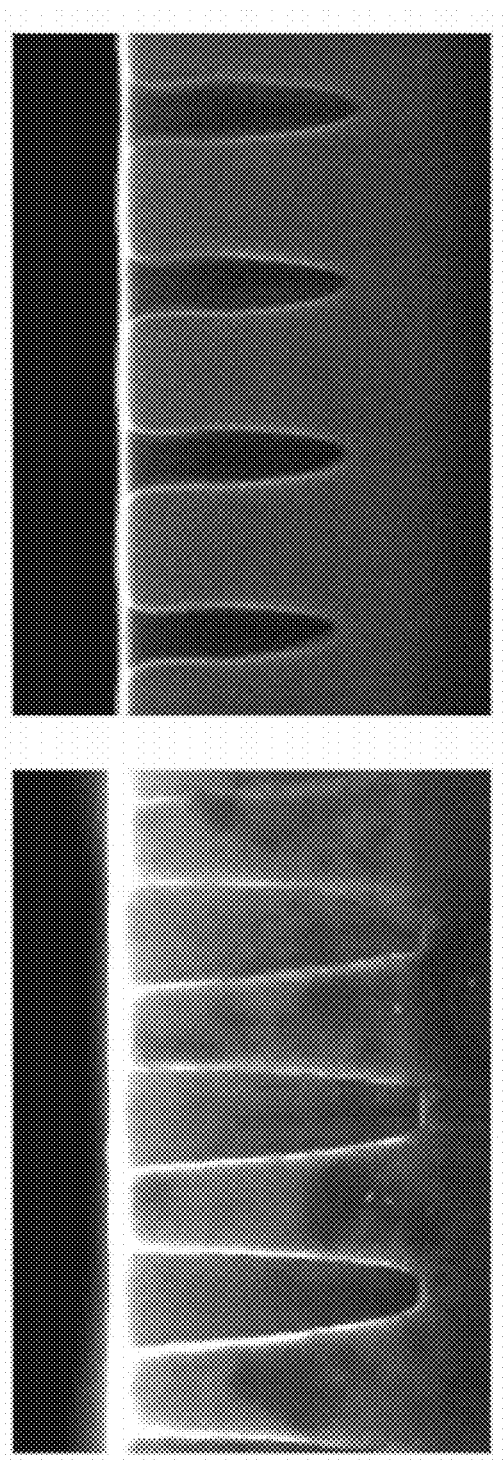

FIG. 10

LAYER STRUCTURE OF PHOTONIC CRYSTAL LASER 200

| NAME | COMPOSITION | DOPANT, DOPING CONCENTRATION (cm$^{-3}$) | THICKNESS (nm) |
|---|---|---|---|
| p-TYPE ELECTRODE 108 | Au, Ni | | 15, 5 |
| p-TYPE CONTACT LAYER 107 | GaN | Mg, $1\times10^{20}$ | 160 |
| PHOTONIC CRYSTAL LAYER 111* | GaN/Air | Mg, $2\times10^{19}$, 0 | 110 |
| PHOTONIC CRYSTAL LAYER 110** | Al$_{0.08}$Ga$_{0.92}$N/Air | Mg, $2\times10^{19}$, 0 | 55 |
| PHOTONIC CRYSTAL LAYER 110 (INCLUDING COVERING LAYER 112) | Al$_{0.08}$Ga$_{0.92}$N/GaN | Mg, $2\times10^{19}$, $2\times10^{18}$ | 55 |
| ELECTRON BLOCKING LAYER 105 | Al$_{0.15}$Ga$_{0.85}$N | Mg, $2\times10^{19}$ | 20 |
| OPTICAL GUIDE LAYER | GaN | 0 | 80 |
| ACTIVE LAYER 103 | In$_{0.09}$Ga$_{0.91}$N/GaN 3QW | 0 | 2.5, 7.5 x 3 |
| OPTICAL GUIDE LAYER | GaN | Si, $2\times10^{19}$ | 20 |
| n-TYPE CLADDING LAYER | Al$_{0.08}$Ga$_{0.92}$N | Si, $2\times10^{19}$ | 600 |
| SUBSTRATE | GaN | | |
| n-TYPE ELECTRODE | Ti, Al | | 20, 100 |

*PHOTONIC CRYSTAL LAYER 111 HAS 160 nm PERIOD AND 72 nm VACANCY DIAMETER
**PHOTONIC CRYSTAL LAYER 110 HAS 160 nm PERIOD AND 48 nm VACANCY DIAMETER

FIG. 15A

LAYER STRUCTURE OF COMPARATIVE EXAMPLE A
(HIGHLY DOPED AND HIGH BAND GAP)

| NAME | COMPOSITION | DOPANT, DOPING CONCENTRATION (cm$^{-3}$) | THICKNESS (nm) |
|---|---|---|---|
| p-TYPE ELECTRODE 108 | Au, Ni | | 15, 5 |
| p-TYPE CONTACT LAYER 107 | GaN | Mg, 1×10$^{20}$ | 160 |
| PHOTONIC CRYSTAL LAYER 106(110)* | Al$_{0.08}$Ga$_{0.92}$N/Air | Mg, 2×10$^{19}$, 0 | 220 |
| ELECTRON BLOCKING LAYER 105 | Al$_{0.15}$Ga$_{0.85}$N | Mg, 2×10$^{19}$ | 20 |
| OPTICAL GUIDE LAYER | GaN | 0 | 80 |
| ACTIVE LAYER 103 | In$_{0.09}$Ga$_{0.91}$N/GaN 3QW | 0 | 2.5, 7.5 × 3 |
| OPTICAL GUIDE LAYER | GaN | Si, 2×10$^{19}$ | 20 |
| n-TYPE CLADDING LAYER | Al$_{0.08}$Ga$_{0.92}$N | Si, 2×10$^{19}$ | 600 |
| SUBSTRATE | GaN | | |
| n-TYPE ELECTRODE | Ti, Al | | 20, 100 |

*PHOTONIC CRYSTAL HAS 160 nm PERIOD AND 64 nm VACANCY DIAMETER

FIG. 15B

LAYER STRUCTURE OF COMPARATIVE EXAMPLE B
(HIGHLY DOPED AND LOW BAND GAP)

| NAME | COMPOSITION | DOPANT, DOPING CONCENTRATION (cm$^{-3}$) | THICKNESS (nm) |
|---|---|---|---|
| p-TYPE ELECTRODE 108 | Au, Ni | | 15, 5 |
| p-TYPE CONTACT LAYER 107 | GaN | Mg, 1×10$^{20}$ | 160 |
| PHOTONIC CRYSTAL LAYER 106(111)* | GaN/Air | Mg, 2×10$^{19}$, 0 | 220 |
| ELECTRON BLOCKING LAYER 105 | Al$_{0.15}$Ga$_{0.85}$N | Mg, 2×10$^{19}$ | 20 |
| OPTICAL GUIDE LAYER | GaN | 0 | 80 |
| ACTIVE LAYER 103 | In$_{0.09}$Ga$_{0.91}$N/GaN 3QW | 0 | 2.5, 7.5 × 3 |
| OPTICAL GUIDE LAYER | GaN | Si, 2×10$^{19}$ | 20 |
| n-TYPE CLADDING LAYER | Al$_{0.08}$Ga$_{0.92}$N | Si, 2×10$^{19}$ | 600 |
| SUBSTRATE | GaN | | |
| n-TYPE ELECTRODE | Ti, Al | | 20, 100 |

*PHOTONIC CRYSTAL HAS 160 nm PERIOD AND 64 nm VACANCY DIAMETER

FIG. 15C

LAYER STRUCTURE OF COMPARATIVE EXAMPLE C
(LOW DOPED AND HIGH BAND GAP)

| NAME | COMPOSITION | DOPANT, DOPING CONCENTRATION (cm$^{-3}$) | THICKNESS (nm) |
|---|---|---|---|
| p-TYPE ELECTRODE 108 | Au, Ni | | 15, 5 |
| p-TYPE CONTACT LAYER 107 | GaN | Mg, 1x10$^{20}$ | 160 |
| PHOTONIC CRYSTAL LAYER 106* | Al$_{0.08}$Ga$_{0.92}$N/Air | Mg, 2x10$^{18}$, 0 | 220 |
| ELECTRON BLOCKING LAYER 105 | Al$_{0.15}$Ga$_{0.85}$N | Mg, 2x10$^{19}$ | 20 |
| OPTICAL GUIDE LAYER | GaN | 0 | 80 |
| ACTIVE LAYER 103 | In$_{0.09}$Ga$_{0.91}$N/GaN 3QW | 0 | 2.5, 7.5 x 3 |
| OPTICAL GUIDE LAYER | GaN | Si, 2x10$^{19}$ | 20 |
| n-TYPE CLADDING LAYER | Al$_{0.08}$Ga$_{0.92}$N | Si, 2x10$^{19}$ | 600 |
| SUBSTRATE | GaN | | |
| n-TYPE ELECTRODE | Ti, Al | | 20, 100 |

*PHOTONIC CRYSTAL HAS 160 nm PERIOD AND 64 nm VACANCY DIAMETER

PHOTONIC CRYSTAL SURFACE EMITTING LASER AND METHOD OF MANUFACTURING THE SAME

BACKGROUND OF THE INVENTION

1. Field of the Invention

The present invention relates to a photonic crystal surface emitting laser and a method of manufacturing the same.

2. Description of the Related Art

In recent years, there are reported many examples in which a photonic crystal is applied to a semiconductor laser. For example, Japanese Patent Application Laid-Open No. 2006-165255 discloses a surface emitting laser in which a two-dimensional photonic crystal is formed in a vicinity of an active layer.

This two-dimensional photonic crystal has cylindrical vacancies or the like disposed periodically in a semiconductor layer, and has a two-dimensional periodic refractive index profile. This periodic refractive index profile enables light generated in the active layer to resonate and form a standing wave for laser oscillation.

This photonic crystal surface emitting laser disclosed in Japanese Patent Application Laid-Open No. 2006-165255 is described with reference to FIG. 13.

FIG. 13 is a cross-sectional view of the photonic crystal surface emitting laser described in Japanese Patent Application Laid-Open No. 2006-165255.

On a substrate 1301, there is formed an n-type cladding layer 1302, on which an active layer 1303 is disposed.

In addition, on the active layer 1303, there is disposed a p-type conductive layer 1304. The p-type conductive layer 1304 includes an electron blocking layer 1305, a photonic crystal layer 1306, and a p-type contact layer 1307. Further, a p-type electrode 1308 and an n-type electrode 1309 are disposed on the upper and lower sides of the device.

The electron blocking layer 1305 is made of a p-type semiconductor having a band gap larger than that of the photonic crystal layer 1306 and is disposed for preventing electrons injected from the n-type cladding layer 1302 to the active layer 1303 from leaking to the p-type conductive layer 1304 (electron leakage).

In the photonic crystal surface emitting laser, the laser oscillation occurs more easily as optical resonance by the photonic crystal is stronger. Strength of the optical resonance by the photonic crystal is determined by an electrical field intensity concentrated on the photonic crystal layer (light confinement).

The photonic crystal surface emitting laser described in Japanese Patent Application Laid-Open No. 2006-165255 has the following problem.

Specifically, in the above-mentioned photonic crystal surface emitting laser, it is difficult to improve the light confinement and to suppress nonradiative recombination while suppressing the electron leakage. The reason is as follows.

The magnitude of the electron leakage is determined by the band gap and the doping concentration of the p-type semiconductor constituting the p-type conductive layer.

In order to suppress the electron leakage, the band gap of the p-type semiconductor constituting the p-type conductive layer should be increased, or the acceptor doping concentration should be increased.

When the band gap of the p-type semiconductor is increased, use of a general compound semiconductor such as gallium nitride or gallium arsenide weakens the light confinement.

It is because, in the case of a general compound semiconductor, the refractive index is smaller as the band gap is larger. Therefore, when as p-type semiconductor having a larger band gap is used, the refractive index at a periphery of the photonic crystal layer is decreased so that the electrical field intensity concentrated on the photonic crystal layer, namely the light confinement, is decreased.

On the other hand, when the acceptor doping concentration of the p-type semiconductor is increased, the nonradiative recombination may be increased.

In the photonic crystal laser, recombination via a defect level of a vacancy surface is a main factor of the nonradiative recombination.

A surface defect level is larger as an impurity concentration, namely the acceptor doping concentration in the p-type semiconductor, is larger.

Therefore, when the acceptor doping concentration is increased, the nonradiative recombination is increased.

SUMMARY OF THE INVENTION

In view of the above-mentioned problem, it is an object of the present invention to provide a photonic crystal surface emitting laser capable of suppressing the electron leakage while improving the light confinement and further capable of suppressing the nonradiative recombination, and to provide a method of manufacturing the photonic crystal surface emitting laser.

In view of the above-mentioned objects, the present invention provides a photonic crystal surface emitting laser, including an n-type cladding layer formed on a substrate; an active layer formed on the n-type cladding layer; an electron blocking layer formed on the active layer and made of a second p-type semiconductor; and a two-dimensional photonic crystal layer that is formed on the electron blocking layer, includes a plurality of layers that are made of a first p-type semiconductor and have different band gaps, and has a high refractive index portion and a low refractive index portion in an in-plane direction, wherein the band gaps of the plurality of layers made of the first p-type semiconductor are smaller than a band gap of the second p-type semiconductor and decrease stepwise or continuously in a lamination direction of the plurality of layers, and wherein a third p-type semiconductor having an acceptor doping concentration smaller than that of the second p-type semiconductor is disposed so as to cover a surface of the electron blocking layer.

The present invention also provides a method of manufacturing a photonic crystal surface emitting laser, including the steps of forming an n-type cladding layer on a substrate; forming an active layer on the n-type cladding layer; forming an electron blocking layer made of a second p-type semiconductor on the active layer; forming a plurality of layers that are made of a first p-type semiconductor and have different band gaps on the electron blocking layer; etching the plurality of layers having different band gaps so as to form a two-dimensional photonic crystal layer having a high refractive index portion and a low refractive index portion in an in-plane direction; and covering a surface of the electron blocking layer with a third p-type semiconductor having an acceptor doping concentration smaller than that of the second p-type semiconductor by heat treatment, wherein the band gaps of the plurality of layers made of the first p-type semiconductor are smaller than a band gap of the second p-type semiconductor and decrease stepwise or continuously in a lamination direction of the plurality of layers. According to the present invention, it is possible to realize a photonic crystal surface emitting laser capable of suppressing the electron leakage while improving the light confinement and further capable of suppressing the nonradiative recombination, and to realize a method of manufacturing the photonic crystal surface emitting laser.

Further features of the present invention will become apparent from the following description of exemplary embodiments with reference to the attached drawings.

BRIEF DESCRIPTION OF THE DRAWINGS

FIG. 3 is a table showing a layer structure of the photonic crystal surface emitting laser according to the embodiment and the example of the present invention.

FIG. 5 is a table showing a calculation result of a light confinement coefficient of the photonic crystal surface emitting laser according to the embodiment of the present invention and comparative examples.

FIGS. 7A, 7B, 7C and 7D are electron microscope photographs showing a vacancy shape change before and after heat treatment in Example 1 of the present invention.

FIG. 10 is a table showing a layer structure of the photonic crystal surface emitting laser according to Example 2 of the present invention.

FIGS. 15A, 15B and 15C are tables showing layer structures of the photonic crystal surface emitting lasers of the comparative examples.

DESCRIPTION OF THE EMBODIMENTS

Hereinafter, an embodiment of the present invention is described.

Embodiment

As the embodiment of the present invention, there is described a structural example of a photonic crystal surface emitting laser in which at least an n-type cladding layer, an active layer, an electron blocking layer, and a two-dimensional photonic crystal layer are laminated in this order on a substrate.

Figure 1:
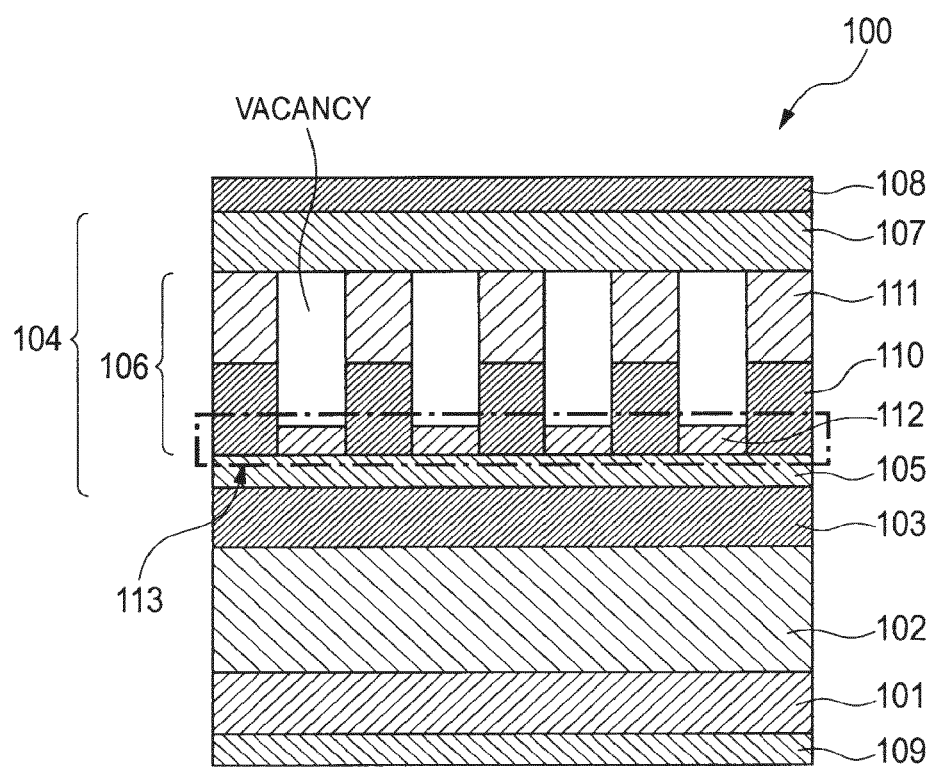
FIG. 1 is a schematic view illustrating a structural example of a photonic crystal surface emitting laser according to an embodiment and an example of the present invention.

FIG. 1 is a cross-sectional view illustrating the photonic crystal surface emitting laser of this embodiment.

A photonic crystal surface emitting laser 100 of this embodiment includes an n-type cladding layer 102, an active layer 103, and a p-type conductive layer 104 formed on a substrate 101.

The p-type conductive layer 104 includes an electron blocking layer 105, a photonic crystal layer 106, and a p-type contact layer 107.

Then, a p-type electrode 108 and an n-type electrode 109 are disposed on the upper and lower ends of the device. The photonic crystal layer 106 formed of a plurality of layers includes two layers, which are a photonic crystal layer 110 and a photonic crystal layer 111 arranged in this order from the side of the electron blocking layer 105.

Further, the band gap of the p-type semiconductor constituting the p-type conductive layer 104 is smaller in the photonic crystal layer 110 than in the electron blocking layer 105, and is smaller in the photonic crystal layer 111 than in the photonic crystal layer 110.

In other words, the band gap of the first p-type semiconductor constituting the photonic crystal layer 106 is smaller than the band gap of the second p-type semiconductor constituting the electron blocking layer 105.

Further, in this example, in the photonic crystal layer 106, the band gap of the first p-type semiconductor changes to decrease stepwise toward the outside (in the lamination direction) from the electron blocking layer side.

In the photonic crystal layer 106, there are periodically formed low refractive index portions including vacancies in a high refractive index portion made of a first p-type semiconductor.

Further, a surface of the electron blocking layer 105 is covered with a covering layer 112 disposed in the low refractive index portion (vacancies) having the two-dimensional periodical structure.

The covering layer 112 is made of a third p-type semiconductor having an acceptor doping concentration smaller than that of the second p-type semiconductor forming the electron blocking layer 105.

With the structure described above, in the photonic crystal surface emitting laser 100 described in the embodiment, it is possible to suppress the electron leakage, to improve the light confinement, and to suppress the nonradiative recombination.

Figure 14:
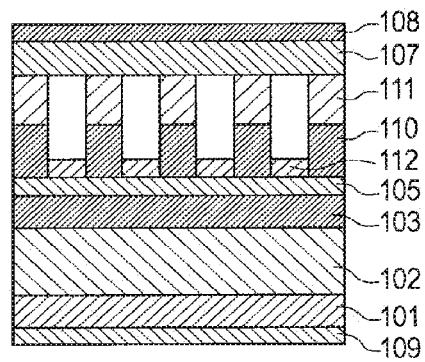
FIGS. 14 and 14A, 14B and 14C are schematic views illustrating structural examples of the photonic crystal surface emitting lasers according to comparative examples.
Figure 14B:
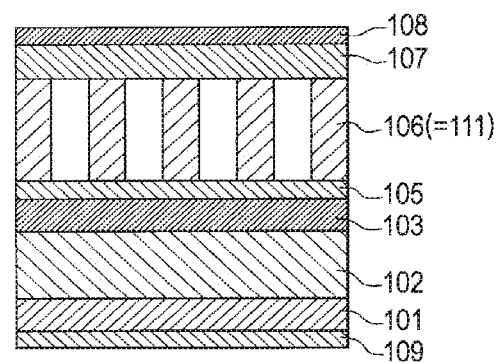
Figure 14A:
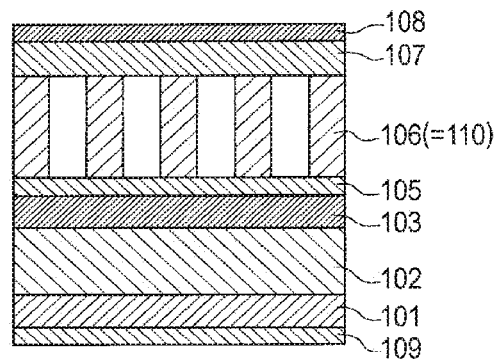
Figure 14C:
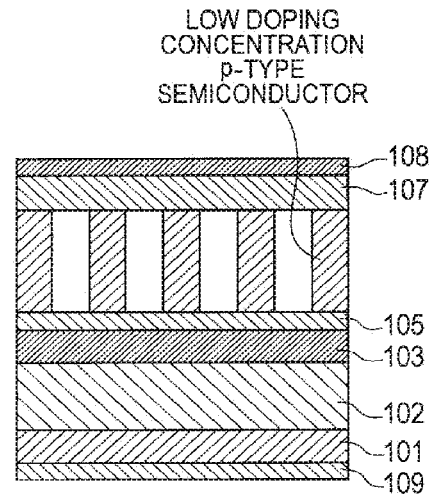

Hereinafter, the photonic crystal laser 100 of the present invention (FIG. 14) is described using three photonic crystal lasers as illustrated in FIGS. 14A to 14C as comparative examples.

The first one is a comparative example A, in which the entire photonic crystal layer 106 is made of the p-type semiconductor forming the photonic crystal layer 110 (having a large doping concentration and a large band gap) for the purpose of preventing the electron leakage (FIG. 14A).

The second one is a comparative example B, in which the entire photonic crystal layer 106 is made of the p-type semiconductor forming the photonic crystal layer 111 (having a small band gap) for the purpose of improving the light confinement (FIG. 14B).

The third one is a comparative example C, in which the entire photonic crystal layer 106 is made of a p-type semiconductor having the same band gap as the p-type semiconductor forming the photonic crystal layer 110 and having the same doping concentration as the p-type semiconductor forming the covering layer 112 (FIG. 14C).

In other words, the comparative example C is a comparative example in which the entire photonic crystal 106 is made of a p-type semiconductor having a low doping concentration (small doping concentration).

Figure 2A:
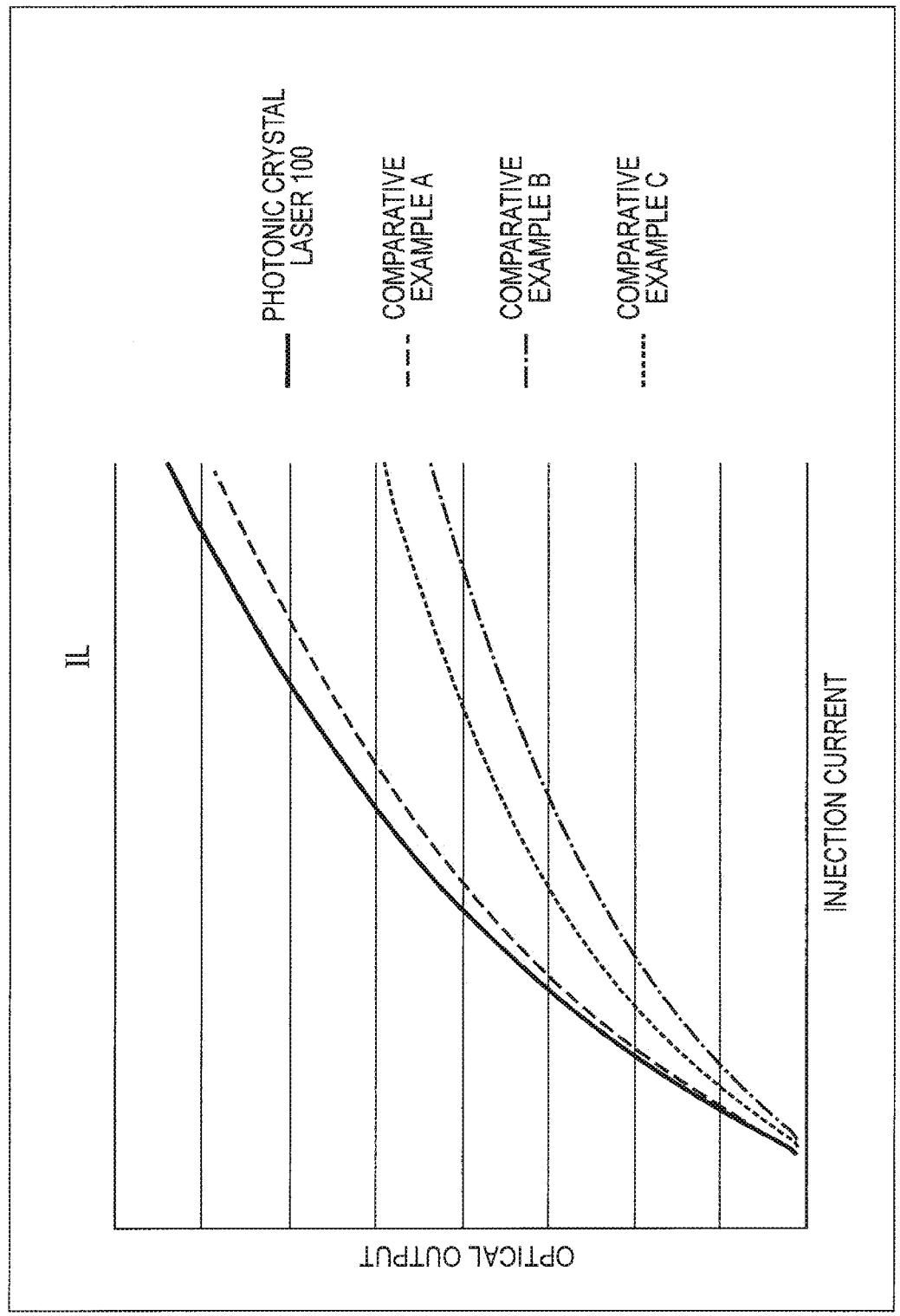
FIGS. 2A and 2B are graphs showing the photonic crystal surface emitting laser according to the embodiment of the present invention and a comparative example.

FIG. 2A shows a result of calculation of optical output of the photonic crystal laser 100, the comparative example A, the comparative example B, and the comparative example C, with respect to injection current (IL characteristics).

The layer structures of the lasers used for the calculation are as shown in FIGS. 3 and 15A to 15C, respectively, and the structure of the photonic crystal laser 100 is the structure of the photonic crystal laser described above in Example 1.

It is understood from FIG. 2A that the comparative example A has an optical output larger than that of the comparative example B or the comparative example C, when the injection current is large. The larger optical output when the injection current is large means that electrons hardly leak out from the active layer.

Therefore, the result of FIG. 2A indicates that the electron leakage is suppressed more in the comparative example A than in the comparative example B or in the comparative example C. This fact supports the above description that the electron leakage can be suppressed more by using a p-type semiconductor having a larger band gap and a larger acceptor doping concentration.

In addition, as understood from FIG. 2A, the photonic crystal laser 100 has an optical output larger than that of any comparative example when the injection current is large. In other words, the photonic crystal laser 100 can suppress the electron leakage more than any comparative example.

The reason of this is described with reference to a band diagram shown in FIG. 2B.

Because the comparative example A has a largest effect of suppressing the electron leakage among the comparative examples, the photonic crystal laser 100 is compared with the comparative example A.

Figure 2B:
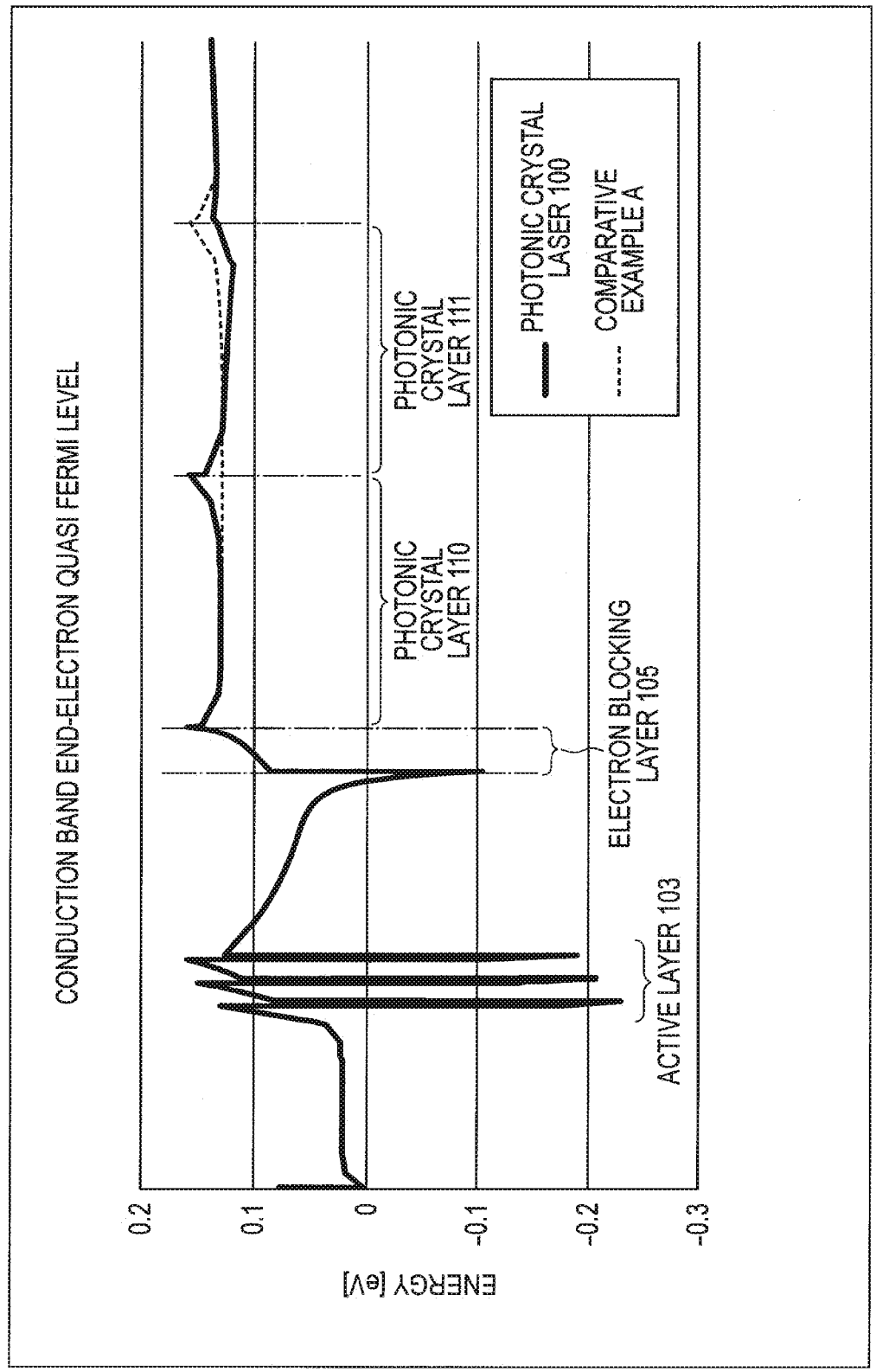

A difference between the conduction band end and the electron quasi fermi level energy shown in FIG. 2B indicates an effective barrier height for electrons. As this difference is larger, the electron leakage can be suppressed more. In the comparative example A, the barrier is high at the interface between the electron blocking layer 105 and the photonic crystal layer 106 (namely, the photonic crystal layer 110), and this part suppresses the electron leakage. On the other hand, in the photonic crystal laser 100, the barrier is high also at the interface between the photonic crystal layer 110 and the photonic crystal layer 111 in addition to the interface between the electron blocking layer 105 and the photonic crystal layer 110.

Therefore, the present invention has an effectively thicker barrier that suppresses the electron leakage and a larger effect of suppressing the electron leakage.

The band near the interface between the photonic crystal layer 110 and the photonic crystal layer 111 reflects band bending in a heterojunction of a p-type semiconductor.

In other words, because the band gap of the p-type semiconductor forming the photonic crystal layer 111 is smaller than the band gap of the p-type semiconductor forming the photonic crystal layer 110, the electron leakage can be suppressed more than in the comparative example A.

Therefore, the thicknesses of the photonic crystal layer 110 and the photonic crystal layer 111 are not limited to the values shown in FIG. 3, and the electron leakage suppression effect can be obtained regardless of the thickness.

In addition, it is not necessary that the photonic crystal layer includes only two layers of the photonic crystal layer 110 and the photonic crystal layer 111 as illustrated in FIG. 1.

Figure 4A:
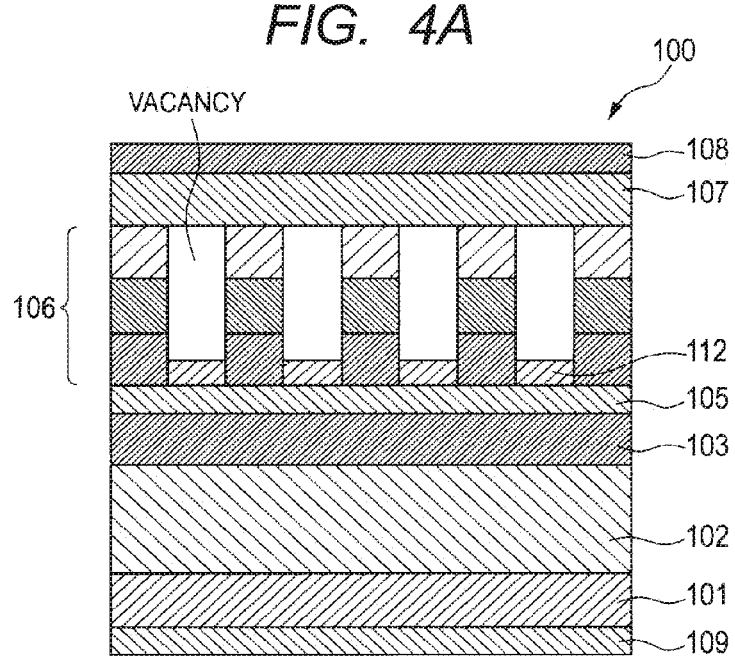
FIGS. 4A and 4B are views illustrating a variation example of the photonic crystal surface emitting laser according to the embodiment of the present invention.

As long as the band gap of the p-type semiconductor layer relatively closer to the active layer is large, three or more photonic crystal layers may be provided as illustrated in FIG. 4A.

It is preferred that the number of layers be larger because the electron leakage can be suppressed more.

Figure 4B:
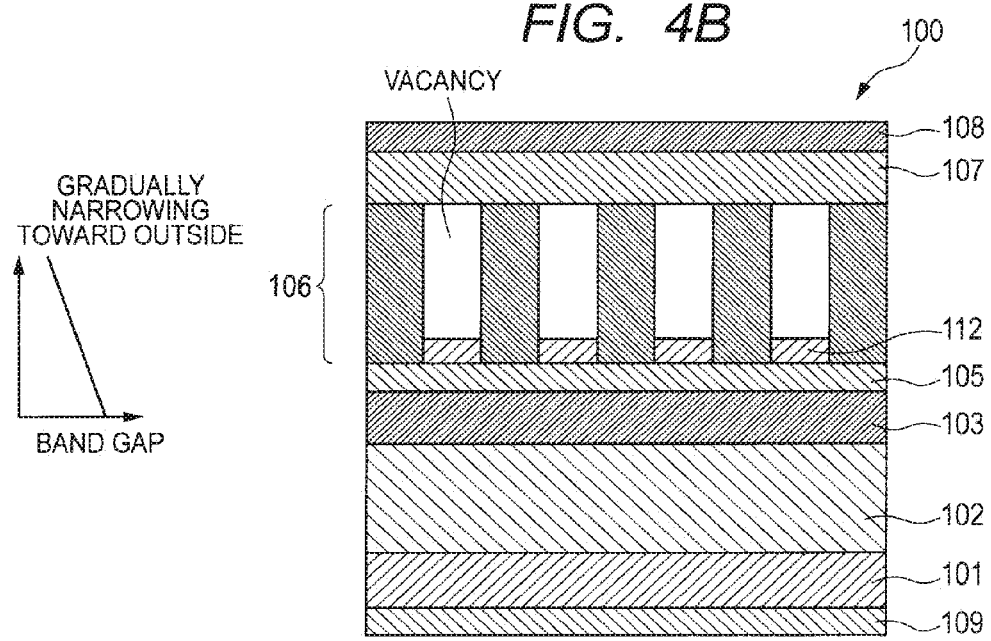

In particular, it is preferred that the band gap of the first p-type semiconductor change to decrease continuously toward the outside from the side of the electron blocking layer 105 (FIG. 4B).

FIG. 5 shows a result of calculation of a light confinement coefficient with respect to the photonic crystal layer of the photonic crystal laser 100, the comparative example A, and the comparative example B. Note that, the layer structures of the lasers used for the calculation are those as shown in FIG. 3.

As described above, the light confinement coefficient is larger as the refractive index in the vicinity of the photonic crystal layer is larger. The comparative example A has a larger band gap of the p-type semiconductor forming the photonic crystal layer 106 than the comparative example B. In the compound semiconductor used for general semiconductor lasers, a refractive index of the material is smaller as a band gap thereof is larger. Therefore, the comparative example A has a lower refractive index of the p-type semiconductor forming the photonic crystal 106 than the comparative example B. Therefore, the light confinement coefficient of the comparative example A is small.

In other words, when the band gap of the p-type semiconductor forming the photonic crystal layer 106 is simply increased for suppressing the electron leakage like the comparative example A, the light confinement coefficient is decreased.

However, in the photonic crystal laser 100, the same or larger light confinement coefficient is obtained than in the comparative example B. There are two reasons of this as follows.

The first reason is that only the photonic crystal layer 110 of the photonic crystal laser 100 has a large band gap unlike the comparative example A in which the entire photonic crystal layer 106 has a large band gap.

Therefore, in the photonic crystal laser 100, the effective refractive index of the entire photonic crystal layer 106 is not decreased as much as the comparative example A.

The second reason is that the covering layer 112 is disposed in the photonic crystal layer 106.

Through the formation of the covering layer 112, the effective refractive index of the entire photonic crystal layer 106 is increased.

Therefore, the photonic crystal laser 100 can achieve the same or larger light confinement coefficient than the comparative example B in which the entire photonic crystal layer 106 is made of the high refractive index p-type semiconductor forming the photonic crystal layer 111.

Figure 6A:
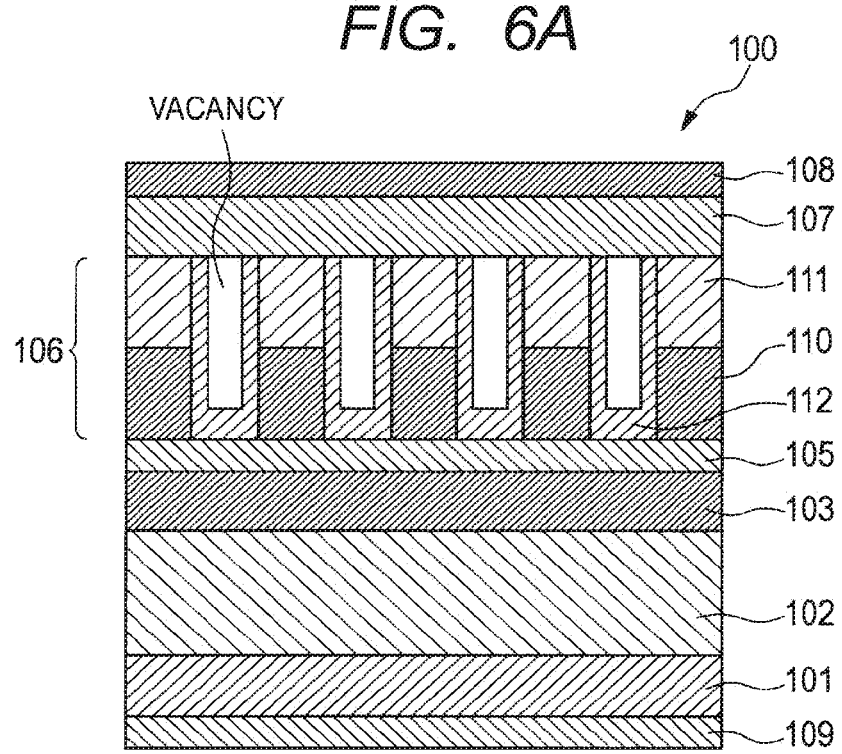
FIGS. 6A and 6B are views illustrating variation examples of the photonic crystal surface emitting laser according to the embodiment of the present invention.
Figure 6B:
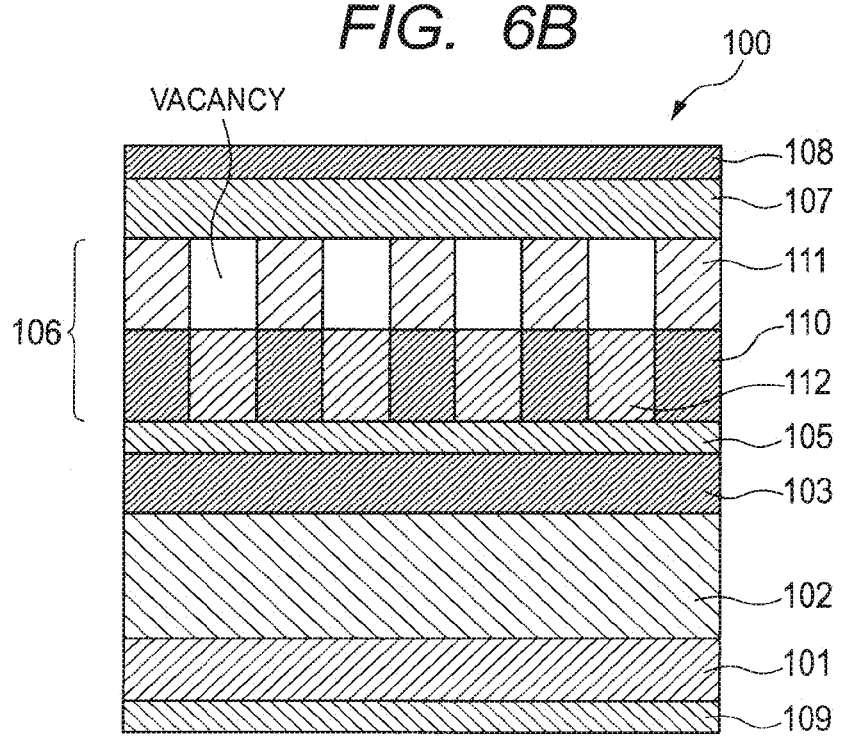

The covering layer 112 may cover not only the upper surface of the electron blocking layer 105 but also the side surface of the vacancy as illustrated in FIG. 6A. Alternatively, as illustrated in FIG. 6B, the covering layer 112 may fill the whole vacancies of the photonic crystal layer 110.

From a viewpoint of the light confinement, it is preferred that a filling factor of the covering layer 112 be higher because the effective refractive index of the entire photonic crystal layer 106 becomes higher.

The band gap of the third p-type semiconductor forming the covering layer 112 may be the same as the band gap of the first p-type semiconductor forming the photonic crystal layer 110.

This is because the first p-type semiconductor forming the photonic crystal layer 110 and the third p-type semiconductor forming the covering layer 112 have different doping concentrations and hence different refractive indexes. Therefore, the portion 113 illustrated in FIG. 1 also works as a photonic crystal.

However, it is more preferred that the band gap of the third p-type semiconductor forming the covering layer 112 be different from the band gap of the first p-type semiconductor in the portion adjacent to the electron blocking layer 105.

This is because the optical resonance is stronger and laser oscillation occurs more easily as a refractive index difference between the first p-type semiconductor forming the photonic crystal layer 110 and the third p-type semiconductor forming the covering layer 112 becomes larger.

Finally, as for the nonradiative recombination, comparison among the photonic crystal laser 100, the comparative example A, and the comparative example C is carried out.

As described above, the nonradiative recombination is caused more, as the acceptor doping concentration of the p-type semiconductor on the vacancy surface becomes larger.

The comparative example A has larger nonradiative recombination on the vacancy surface because the acceptor doping concentration of the p-type semiconductor forming the photonic crystal layer 106 is larger than the comparative example C. In other words, when the acceptor doping concentration of the p-type semiconductor constituting the p-type conductive layer is simply increased for suppressing the electron leakage as in the comparative example A, the nonradiative recombination is increased.

However, the photonic crystal laser 100 can suppress the nonradiative recombination equally or more than the comparative example C. There are two reasons of this as follows.

The first reason is that the p-type semiconductor exposed to the vacancy surface in the lower portion of the photonic crystal layer 106 is the covering layer 112 having a small acceptor doping concentration in the photonic crystal laser 100.

An electron concentration in the p-type conductive layer becomes smaller with increasing distance from the active layer. Therefore, the nonradiative recombination occurs mainly in the lower portion of the photonic crystal layer 106.

In the photonic crystal laser 100, the lower portion of the photonic crystal layer 106 is formed of the covering layer 112 made of the p-type semiconductor having a small acceptor doping concentration similarly to the comparative example C, and hence the nonradiative recombination can be suppressed to the same level as the comparative example C.

The second reason is that between the covering layer 112 and the electron blocking layer 105 a weak reverse bias state is formed because the covering layer 112 is made of a p-type semiconductor having a smaller acceptor doping concentration than the electron blocking layer 105.

The reverse bias prevents electrons from flowing from the electron blocking layer 105 to the covering layer 112, and as a result, the nonradiative recombination on the vacancy surface can be suppressed.

On the other hand, the comparative example C does not generate the reverse bias because the covering layer 112 is not provided. Therefore, the photonic crystal laser 100 can suppress the nonradiative recombination equally or more than the comparative example C.

The covering layer 112 can suppress the nonradiative recombination when it covers the upper surface of the electron blocking layer 105. However, as illustrated in FIG. 6A, it is more preferred to cover the vacancy side surface in the photonic crystal layer 106 too, because the nonradiative recombination on the vacancy side surface can be suppressed.

As described above, the photonic crystal laser 100, to which the present invention is applied, is a photonic crystal laser capable of suppressing the electron leakage, improving the light confinement, and suppressing the nonradiative recombination. For the semiconductor and the active layer in the surface emitting laser in this embodiment, ordinary materials used for a semiconductor laser can be used.

Examples of the materials include GaAs, AlGaAs, GaInP, AlGaInP, GaN, InGaN, AlGaN, and the like. However, the effect of the present invention is larger when the present invention is applied to photonic crystal laser made of a nitride semiconductor such as GaN, InGaN, or AlGaN, because the electron leakage and the surface recombination are particularly large when the nitride semiconductor is used.

In addition, the photonic crystal surface emitting laser can also be used as a light source for an image forming apparatus. Specifically, the image forming apparatus includes a surface emitting laser array in which a plurality of photonic crystal surface emitting lasers are disposed, a photoreceptor that forms an electrostatic latent image by light from the surface emitting laser array, a charging unit that electrifies the photoreceptor, and a developing unit that develops the electrostatic latent image.

EXAMPLES

Hereinafter, examples of the present invention are described. The following examples specifically describe the structure of the photonic crystal surface emitting laser described above in the embodiment and the method of manufacturing the same.

Example 1

FIG. 1 illustrates the cross-sectional view of the photonic crystal surface emitting laser 100 of Example 1. Further, FIG. 3 shows the composition, the doping concentration, and the thickness of each layer, and the structure of the photonic crystal.

As described above in the embodiment, the photonic crystal laser 100 described in this example is a photonic crystal laser that can suppress the electron leakage, improve the light confinement, and suppress the nonradiative recombination more than the comparative example A, the comparative example B, and the comparative example C. A method of manufacturing the photonic crystal surface emitting laser 100 of Example 1 is described. First, by an MOCVD method, nitride semiconductors are sequentially formed on an n-type GaN substrate up to the electron blocking layer 105 made of p-$Al_{0.15}Ga_{0.85}N$, so as to make the layer structure shown in FIG. 3.

Next, by the same MOCVD method, a layer of p-$Al_{0.08}Ga_{0.92}N$, which becomes the photonic crystal layer 110 later, is formed to have a thickness of 110 nm, and a layer of p-GaN, which becomes the photonic crystal layer 111 later, is formed to have a thickness of 110 nm.

As dopants, Si as a donor and Mg as an acceptor are used. Then, the process goes to formation of the photonic crystal.

First, a film made of $SiO_2$ is formed by CVD.

Next, a photonic crystal pattern made of a resist is formed by electron beam lithography. Next, through use of the resist as a mask, dry etching of SiO₂ is carried out using CF₄ gas. After that, through use of the remaining SiO₂ as a mask, GaN and $Al_{0.08}Ga_{0.92}N$ are etched to form a vacancy of 220 nm using Cl₂ gas.

Finally, SiO₂ is removed with hydrogen fluoride. In this way, the vacancies are formed to be arranged periodically in the in-plane direction of the substrate. In other words, the photonic crystal layer 110 and the photonic crystal layer 111 are formed.

After that, the substrate is heated up to 900° C. in an atmosphere of NH₃ gas containing nitrogen atoms as a group V element. In this case, flow rates of gases are set to 5 slm for the N₂ gas and 10 slm for the NH₃ gas. When the substrate temperature reaches 900° C., the temperature is maintained to be 900° C. and heat treatment is performed for 30 minutes.

In this step, the covering layer 112 made of p-GaN having a doping concentration smaller than that of the electron blocking layer 105 is formed on the surface of the electron blocking layer 105 and on the side surfaces of vacancies in the photonic crystal layer 106. The reason of this is described below.

When crystal of AlN is grown, the growing temperature thereof is 1,400° C. or higher. When the substrate is heated to 900° C. as in this step, Al atoms in the photonic crystal laser 100 hardly move.

On the other hand, when crystal of GaN is grown, the growing temperature thereof is approximately 1,000° C., but Ga atoms are slightly diffused on the surface even at 900° C. so that a mass transport occurs.

Therefore, in this heat treatment step, the mass transport of Ga atoms occurs from the surface of the photonic crystal layer 111 so that the Ga atoms move to the surface of the electron blocking layer 105 and the side surfaces of vacancies in the photonic crystal layer 106.

After that, the Ga atoms react with nitrogen atoms in the NH₃ gas so that a covering layer made of p-GaN is formed on the surface of the electron blocking layer 105 and on the side surfaces of vacancies in the photonic crystal 106.

FIGS. 7A to 7D are electron microscope photographs of vacancies formed in GaN by an electron beam lithography and dry etching as in the manufacturing steps described above.

Figure 7A:
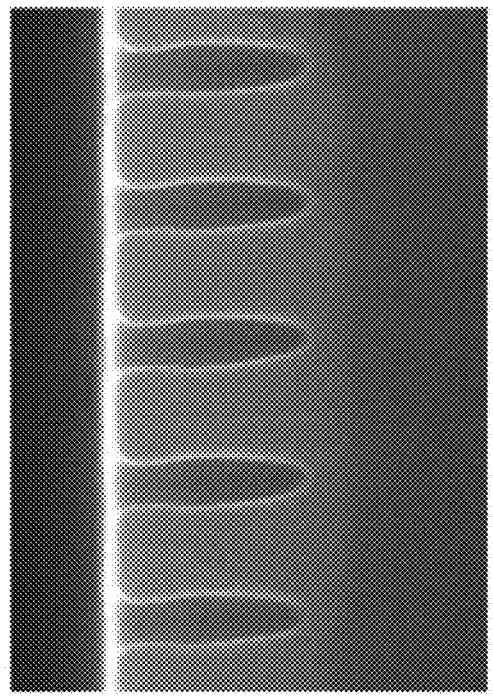
Figure 7B:
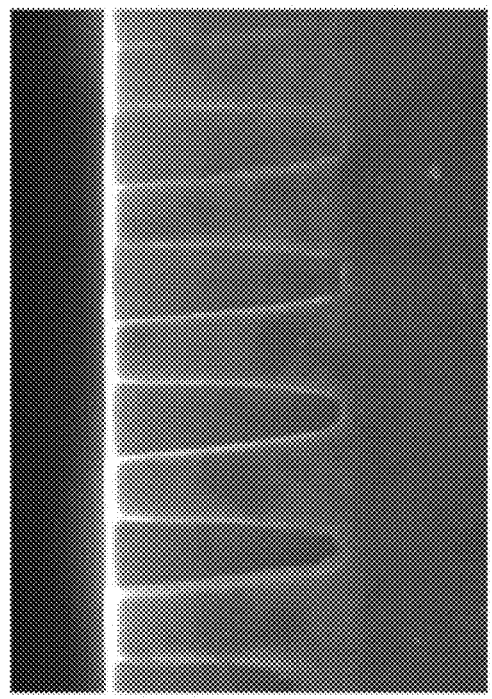

FIG. 7A shows the electron microscope photograph before this heat treatment step, and FIG. 7B shows the electron microscope photograph after this heat treatment step.

From comparison between FIGS. 7A to 7B, it is understood that the vacancy shape has changed before and after the heat treatment step. In particular, it is understood that the shape of the vacancy bottom is changed and that the mass transport of Ga atoms has occurred in this heat treatment step.

Note that, the heating temperature in the heat treatment step is sufficient when the heating temperature is 850° C. or higher. FIGS. 7C and 7D are electron microscope photographs when the heating temperature was changed to 850° C. in the heat treatment step described above.

FIG. 7C shows the electron microscope photograph before the heat treatment step, and FIG. 7D shows the electron microscope photograph after the heat treatment step.

As understood from FIGS. 7A to 7D, the change of the vacancy bottom shape occurs even in the case where the heat treatment is performed at 850° C., though the change is smaller than that in the case where the heat treatment is performed at 900° C.

The photonic crystal layer 111 is made of p-GaN in Example 1, but the photonic crystal layer 111 may be made of p-AlGaN.

It is because that Al atoms do not move and the mass transport of only Ga atoms occurs selectively even when the photonic crystal layer 111 is made of p-AlGaN.

In other words, it is sufficient when the photonic crystal layer 111 is made of $p\text{-}Al_xGa_{(1-x)}N$ (0<=x<1).

Next, the motion of Mg as an acceptor is considered.

Figure 8:
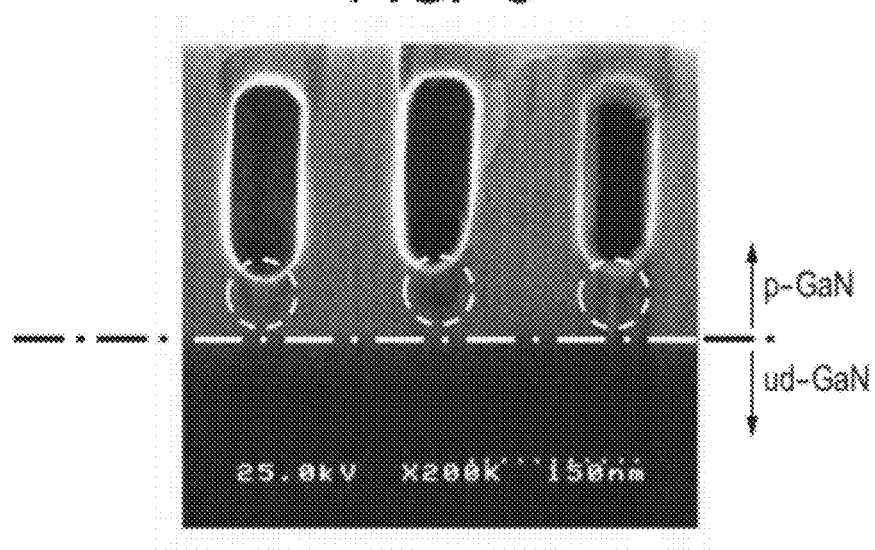
FIG. 8 is an electron microscope photograph showing an acceptor concentration distribution after a heat treatment step according to Example 1 of the present invention.

FIG. 8 is an electron beam microscope photograph of vacancies formed by the electron beam lithography, dry etching, and heat treatment step as in the manufacturing steps described above.

Note that, a region 300 lower than the dashed dotted line of FIG. 8 is an undoped (ud-)GaN region, and a region 301 upper than the dashed dotted line is a p-GaN region in which Mg is doped.

The Mg-doped region 301 looks brighter than the ud-GaN region 300. A contrast of the electron beam microscope photograph reflects uneven profiles, composition, crystallinity, magnetic properties, potentials, and the like.

In FIGS. 7A to 7D, the contrast reflects a difference in Mg composition between the region 300 and the region 301 which causes a potential difference. The photograph looks brighter as an Mg concentration is higher. Therefore, the Mg concentration can be estimated from a brightness of the electron beam microscope photograph.

As understood from FIG. 8, the Mg concentration is low in a part in which the mass transport of Ga atoms has taken place in the heat treatment step (encircled by the dotted line). Therefore, it is possible to set the doping concentration of the covering layer 112 made of p-GaN formed in this heat treatment step smaller than that of the electron blocking layer 105.

As described above, in the manufacturing method described above in Example 1, the covering layer 112 can be formed on the surface of the electron blocking layer 105 and on the side surfaces of vacancies in the photonic crystal layer 106 only by the heat treatment step in which heating is carried out in an atmosphere containing nitrogen.

As other method of forming the covering layer 112, there is a method of using multi-step regrowth as described in Example 2.

However, the manufacturing steps become complicated because portions in which the regrowth is inhibited need to be covered with a mask, for example. Therefore, it is preferred to adopt the manufacturing steps of Example 1 in which the covering layer 112 can be formed only by the heat treatment step.

Note that, the shape of the covering layer 112 may be changed depending on a condition of the heat treatment step. For instance, when the heat treatment temperature is raised, the amount of atoms involved in the mass transport increases. Therefore, the covering layer 112 is increased, and the structure illustrated in FIG. 6A or 6B can be formed.

In addition, the covering layer 112 is made of p-GaN while the photonic crystal layer 110 is made of $p\text{-}Al_{0.08}Ga_{0.92}N$, which are p-type semiconductors having different band gaps. As described above, it is preferred that the p-type semiconductors forming the covering layer 112 and that forming the photonic crystal layer 110 have different band gaps, because the laser oscillation can occur easily by the refractive index difference.

In the final step of the manufacturing steps, the p-type contact layer 107 is grown by MOCVD, again.

Then, the p-type electrode 108 made of Ni having a thickness of 10 nm and Au having a thickness of 40 nm, and the n-type electrode 109 made of Ti having a thickness of 20 nm and Al having a thickness of 100 nm are disposed by electron beam vapor deposition so that the photonic crystal laser 100 can be manufactured.

The two-layered photonic crystal layer 106 is exemplified in Example 1, but it is obvious that three or more layers of the photonic crystal layer 106 can be formed as illustrated in FIGS. 4A and 4B when the growth condition of the MOCVD method is changed.

Example 2

Figure 9:
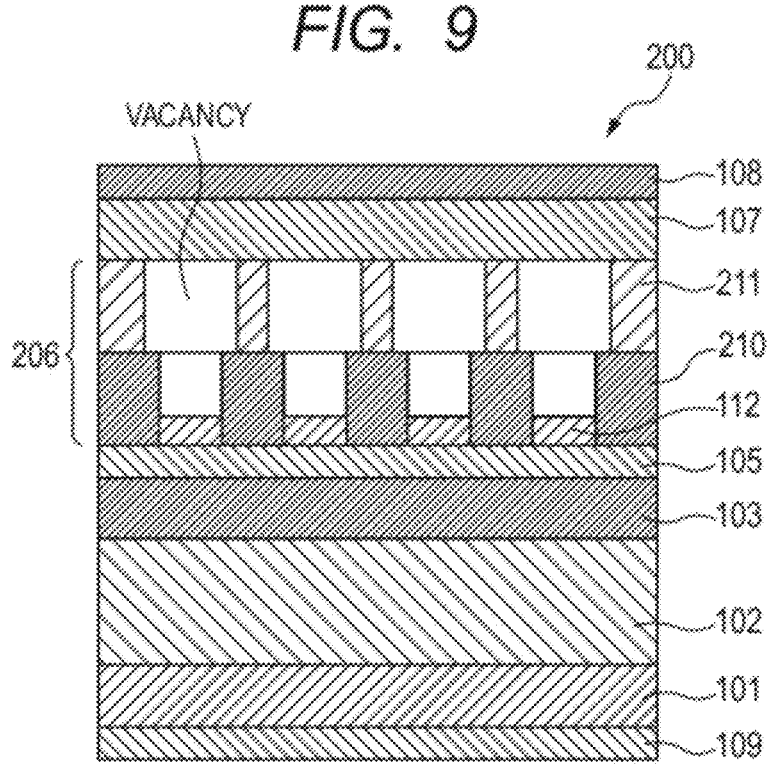
FIG. 9 is a schematic view of a photonic crystal surface emitting laser according to Example 2 of the present invention.

The cross-sectional view of a photonic crystal surface emitting laser 200 of Example 2 is illustrated in FIG. 9. Further, the composition, the doping concentration, and the thickness of each layer, and the structure of the photonic crystal are shown in FIG. 10.

The photonic crystal surface emitting laser 200 described in Example 2 is different from the photonic crystal surface emitting laser 100 described in Example 1 only in the structure of photonic crystal layer 206. In FIGS. 9 and 10, layers having the same structures as in Example 1 are denoted by the same numerals as in FIGS. 1 and 3.

The photonic crystal layer 206 includes a photonic crystal layer 210 made of $p\text{-}Al_{0.08}Ga_{0.92}N$ and a photonic crystal layer 211 made of p-GaN having a filling factor of the p-type semiconductor lower than that of the photonic crystal layer 210.

It is preferred that the filling factor of the p-type semiconductor of the photonic crystal layer 211 be lower than that of the photonic crystal layer 210, because absorption by the p-type electrode 108 is decreased. The reason of this is as follows.

In order to decrease the absorption by the p-type electrode 108, an electrical field distribution is kept away from the p-type electrode 108.

The photonic crystal layer 210 is farther from the p-type electrode than the photonic crystal layer 211, and hence the electrical field distribution is closer to the photonic crystal 210 than the photonic crystal layer 211.

Therefore, it is understood that the effective refractive index of the photonic crystal layer 211 is set lower than the effective refractive index of the photonic crystal layer 210.

The effective refractive index is determined by the refractive index of the material of the p-type semiconductor and the filling factor of the p-type semiconductor, and hence the absorption by the p-type electrode 108 can be reduced when the filling factor of the p-type semiconductor in the photonic crystal layer 211 is set smaller than that in the photonic crystal layer 210.

In Example 2, the structure in which the photonic crystal layer 206 includes two layers is described, but the photonic crystal layer 206 may include three or more layers.

Figure 11:
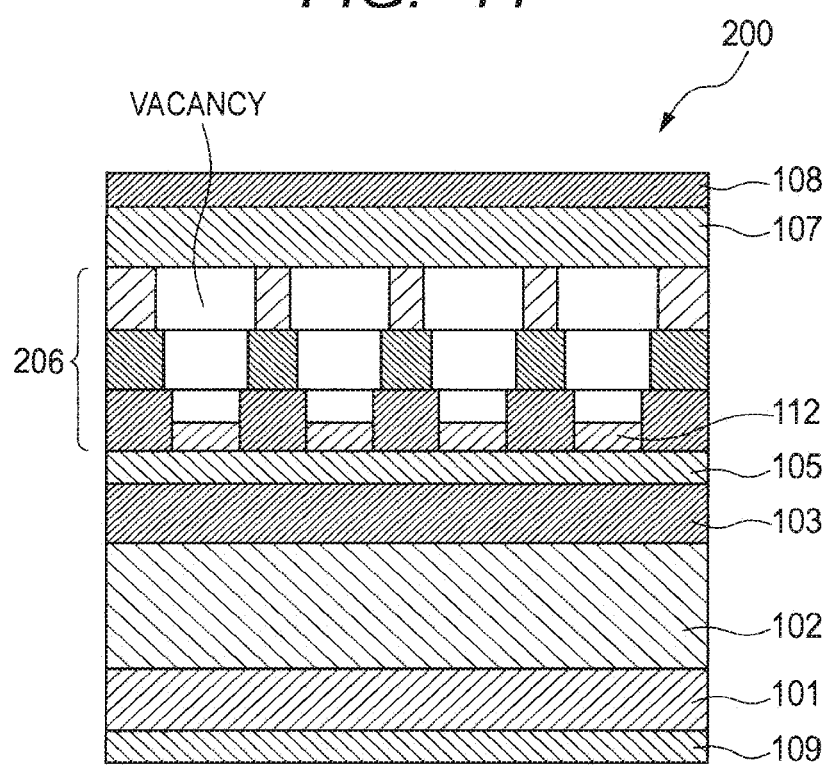
FIG. 11 is a view illustrating a variation example of the photonic crystal surface emitting laser according to Example 2 of the present invention.

When the filling factor of the p-type semiconductor is changed to decrease from the electron blocking layer 105 toward the outside as illustrated in FIG. 11, the absorption by the p-type electrode 108 can be reduced.

Next, a method of manufacturing the photonic crystal surface emitting laser 200 of Example 2 is described.

First, as in Example 1, nitride semiconductors are sequentially laminated by the MOCVD method until the electron blocking layer 105 made of $p\text{-}Al_{0.15}Ga_{0.85}N$.

Figure 12A:
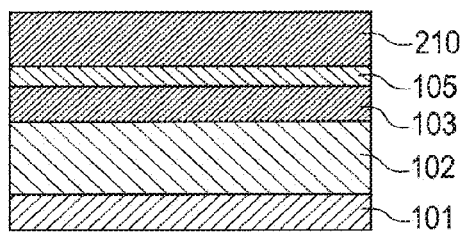
FIGS. 12A, 12B, 12C, 12D, 12E and 12F are views illustrating manufacturing steps of the photonic crystal surface emitting laser according to Example 2 of the present invention.

Then, a layer of $p\text{-}Al_{0.08}Ga_{0.92}N$ to be the photonic crystal layer 210 later is formed by the MOCVD method to have a thickness of 110 nm (FIG. 12A).

Figure 12D:
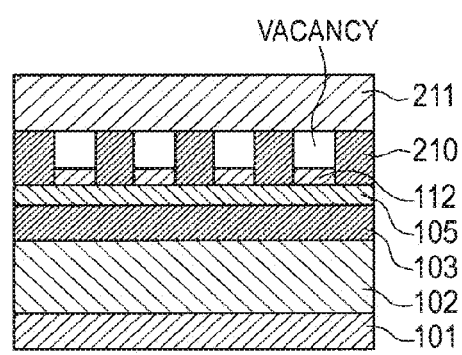
Figure 12B:
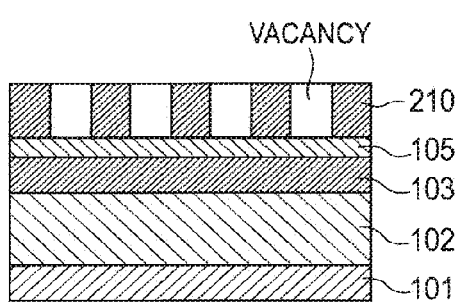

Next, similarly to Example 1, the photonic crystal layer 210 is formed by the electron beam lithography and the dry etching (FIG. 12B).

Figure 12E:
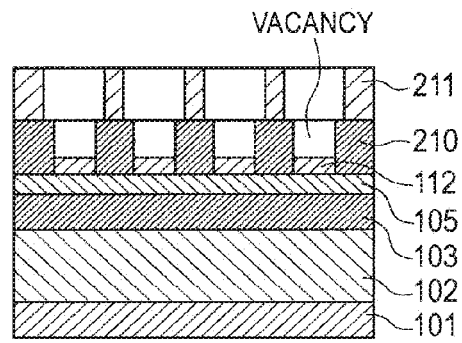
Figure 12C:
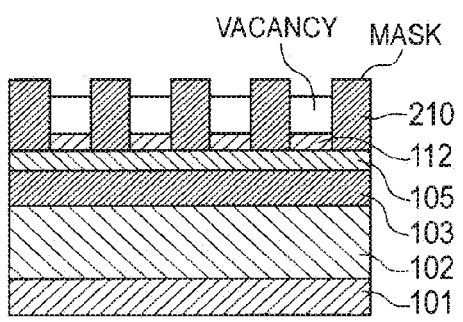

Next, the upper surface of the photonic crystal layer 210 except for the vacancies is masked, and the covering layer 112 is formed on the upper surface of the electron blocking layer 105 by the MOCVD method (FIG. 12C).

In this case, the flow rate of $CP_2Mg$ as an Mg source is set smaller than the flow rate of $CP_2Mg$ for growth of the electron blocking layer 105 so that the acceptor doping concentration of the covering layer 112 becomes smaller than the acceptor doping concentration of the electron blocking layer 105.

After removing the mask, p-GaN to be the photonic crystal layer 211 later is regrown on the photonic crystal layer 210 to have a thickness of 110 nm by the MOCVD (FIG. 12D).

Next, similarly, the photonic crystal layer 211 is formed by the electron beam lithography and the dry etching (FIG. 12E).

In this case, the photonic crystal 211 is formed to have a vacancy diameter larger than that of the photonic crystal 210.

Figure 12F:
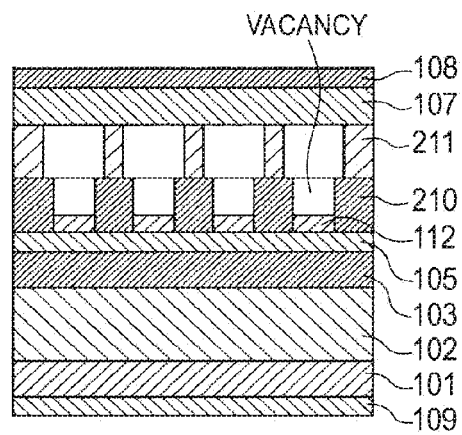
Figure 13:
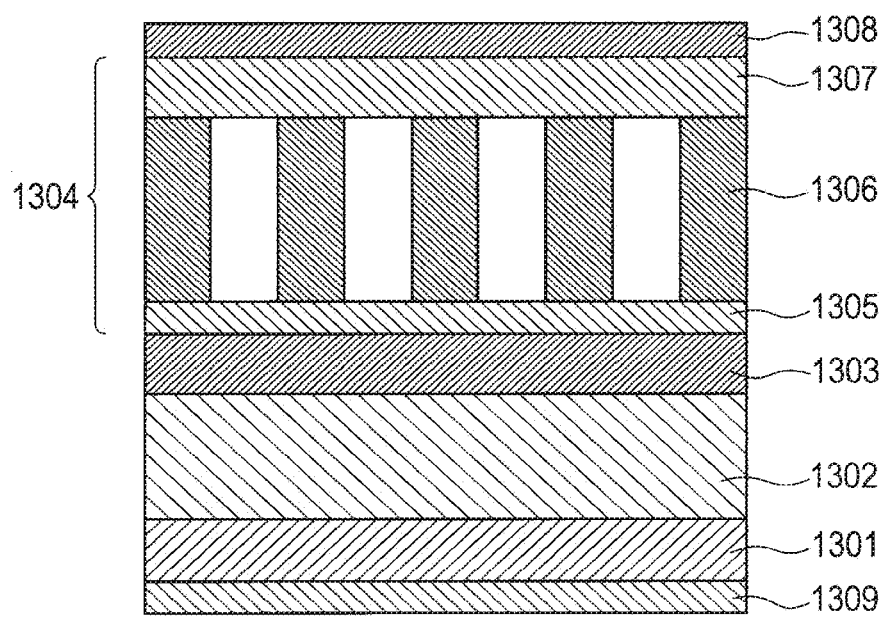
FIG. 13 is a schematic view illustrating a structure of a photonic crystal surface emitting laser according to a prior arts example.

Finally, the p-type contact layer 107 is grown again by the MOCVD, and the p-type electrode 108 and the n-type electrode 109 are disposed by the electron beam vapor deposition. Thus, the photonic crystal laser 200 can be manufactured (FIG. 12F).

The manufacturing steps described in Example 2 are more complicated than the manufacturing steps of Example 1, but it is possible to control vacancy diameters of the photonic crystal layer 210 and the photonic crystal layer 211 independently of each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-137481, filed Jun. 21, 2011, which is hereby incorporated by reference herein in its entirety.

What is claimed is:

1. A surface emitting laser, comprising:
an n-type cladding layer
an active layer on said n-type cladding layer;
an electron blocking layer on said active layer; and
a photonic crystal layer on said electron blocking layer,
wherein said photonic crystal layer has a high refractive index portion made of a first p-type semiconductor and a low refractive index portion in an in-plane direction of said active layer,
wherein said electron blocking layer is made of a second p-type semiconductor,
wherein a band gap of said first p-type semiconductor is smaller than a band gap of said second p-type semiconductor,
wherein the band gap of said first p-type semiconductor decreases stepwise or continuously from an electron blocking layer side of said photonic crystal layer to an opposite side of said photonic crystal layer, and
wherein a third p-type semiconductor having an acceptor doping concentration smaller than that of said second p-type semiconductor is disposed so as to cover a surface of said electron blocking layer corresponding to the low refractive index portion.

2. The surface emitting laser according to claim 1, wherein a band gap of said third p-type semiconductor is different from a band gap of said first p-type semiconductor.

3. The surface emitting laser according to claim 1, wherein said third p-type semiconductor is disposed so as to cover a side surface of said first p-type semiconductor in said low refractive index portion.

4. The surface emitting laser according to claim 1, wherein said photonic crystal layer includes a plurality of layers.

5. The surface emitting laser according to claim 1, wherein said first p-type semiconductor, said second p-type semiconductor, and said third p-type semiconductor are all made of a nitride semiconductor.

6. A method of manufacturing a surface emitting laser, comprising the steps of:
   forming an n-type cladding layer;
   forming an active layer on the n-type cladding layer;
   forming an electron blocking layer made of a second p-type semiconductor on the active layer;
   forming a photonic crystal layer having a high refractive index portion made of a first p-type semiconductor and a low refractive index portion in an in-plane direction of the active layer; and
   covering a surface of the electron blocking layer corresponding to the low refractive index portion with a third p-type semiconductor having an acceptor doping concentration smaller than that of the second p-type semiconductor,
   wherein the band gap of the first p-type semiconductor is smaller than a band gap of the second p-type semiconductor, and
   wherein the band gap of the first p-type semiconductor decreases stepwise or continuously from an electron blocking layer side of the photonic crystal layer to an opposite side of the photonic crystal layer.

7. The method of manufacturing the surface emitting laser according to claim 6, wherein the first p-type semiconductor comprises $Al_xGa_{1-x}N$ ($0<=x<1$), and the third p-type semiconductor comprises GaN.

8. The method of manufacturing the surface emitting laser according to claim 6, wherein, in said step of covering, heat treatment is performed in a gas atmosphere containing a group V element.

9. The method of manufacturing the surface emitting laser according to claim 8, wherein the group V element comprises nitrogen atoms.

10. The method of manufacturing the surface emitting laser according to claim 8, wherein the heat treatment is performed at a heating temperature of 850° C. or higher.

11. The method of manufacturing the surface emitting laser according to claim 7, further comprising the step of covering a side surface of the first p-type semiconductor with the third p-type semiconductor.

12. An image forming apparatus, comprising:
   a surface emitting laser array in which a plurality of photonic emitting lasers according to claim 1 are disposed;
   a photoreceptor that forms an electrostatic latent image by light from said surface emitting laser array;
   a charging unit that electrifies said photoreceptor; and
   a developing unit that develops the electrostatic latent image.

13. The surface emitting laser according to claim 1, wherein a refractive index of said first p-type semiconductor is different from a refractive index of said third p-type semiconductor.

14. The surface emitting laser according to claim 1, wherein a band gap of said third p-type semiconductor is same as the band gap of said first p-type semiconductor.

15. The surface emitting laser according to claim 1, wherein said low refractive index portion includes a vacancy.

16. The surface emitting laser according to claim 4, wherein said photonic crystal layer is formed so that the filling factor of said first p-type semiconductor in said plurality of layers decreases stepwise or continuously from the electron blocking layer side to the opposite side.

17. The method of manufacturing of the surface emitting laser according to claim 6, wherein said photonic crystal layer includes a plurality of layers.

18. The method of manufacturing of the surface emitting laser according to claim 17, wherein said photonic crystal layer is formed so that the filling factor of said first p-type semiconductor in said plurality of layers decreases stepwise or continuously from the electron blocking layer side to the opposite side.

* * * * *